(12) United States Patent
Li et al.

(10) Patent No.: US 7,454,645 B2
(45) Date of Patent: Nov. 18, 2008

(54) CIRCUIT AND METHOD FOR MONITORING THE STATUS OF A CLOCK SIGNAL

(75) Inventors: Gabriel M. Li, San Francisco, CA (US); Greg J. Richmond, Sunnyvale, CA (US); Sangeeta Raman, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 290 days.

(21) Appl. No.: 11/097,527

(22) Filed: Mar. 31, 2005

(65) Prior Publication Data

US 2006/0224910 A1 Oct. 5, 2006

(51) Int. Cl.
*G06F 1/00* (2006.01)
*G06F 1/14* (2006.01)

(52) U.S. Cl. .................. 713/500; 713/502; 327/40; 327/47; 327/48; 377/39

(58) Field of Classification Search .................. 713/500
See application file for complete search history.

(56) References Cited

U.S. PATENT DOCUMENTS

| | | | |
|---|---|---|---|
| 4,374,361 A | 2/1983 | Holden | |
| 4,446,437 A | 5/1984 | Rinaldi | |
| 4,507,544 A | 3/1985 | Jones | |
| 4,860,288 A | 8/1989 | Teske et al. | |
| 4,931,748 A | 6/1990 | McDermott et al. | |
| 5,099,153 A | 3/1992 | Adams | |
| 5,161,175 A | 11/1992 | Parker et al. | |
| 5,561,390 A | 10/1996 | Hiiragizawa | |
| 5,610,561 A * | 3/1997 | Zarrabian | 331/49 |
| 5,832,033 A | 11/1998 | Takahashi | |
| 5,903,748 A | 5/1999 | McCollough et al. | |
| 6,008,671 A | 12/1999 | Kang | |
| 6,137,332 A | 10/2000 | Inoue et al. | |
| 6,329,853 B1 | 12/2001 | Iinuma | |
| 6,563,346 B2 * | 5/2003 | Abbiate et al. | 327/48 |
| 6,782,065 B1 | 8/2004 | Yamanaka et al. | |
| 6,788,655 B1 | 9/2004 | Underbrink | |
| 6,961,287 B2 * | 11/2005 | Jung | 368/155 |
| 7,038,508 B2 * | 5/2006 | Parker et al. | 327/156 |
| 7,084,810 B2 * | 8/2006 | Kitatani | 342/357.12 |
| 7,157,942 B2 * | 1/2007 | Meltzer | 327/3 |

FOREIGN PATENT DOCUMENTS

EP 1538451 6/2005

OTHER PUBLICATIONS

International Search Report, PCT/US2006/010252, mailed Aug. 31, 2006.

* cited by examiner

*Primary Examiner*—Nitin C Patel
(74) *Attorney, Agent, or Firm*—Kevin L. Daffer; Daffer McDaniel, LLP

(57) ABSTRACT

A circuit and method are provided herein for monitoring the status of a clock signal. In general, the method may include supplying a pair of clock signals to a clock monitor circuit, which is configured for monitoring a status of one clock signal relative to the other. The status indicates whether the frequency of the one clock signal is faster, slower or substantially equal to the frequency of the other clock signal. Once determined, the status may be stored as a bit pattern within a status register, which is operatively coupled to the clock monitor circuit. This enables the status to be read by detecting a logic state of one or more bits within the status register.

19 Claims, 6 Drawing Sheets

CIRCUIT AND METHOD FOR MONITORING THE STATUS OF A CLOCK SIGNAL

BACKGROUND OF THE INVENTION

1. Field of the Invention

This invention relates to clock monitoring circuits and, more particularly, to a circuit and method for monitoring the status of a first clock signal relative to a second clock signal. In one embodiment, the status indicates whether the frequency of the first clock signal is faster, slower or substantially equivalent to the frequency of the second clock signal.

2. Description of the Related Art

The following descriptions and examples are given as background only.

Many electronic systems, such as microprocessors and other integrated circuits, require stable clock signals to perform their internal operations. In very early integrated circuit (IC) microprocessor designs, the clock signals were provided by circuits external to the microprocessor, typically in the form of an off-chip integrated circuit dedicated to that purpose. In more recent designs, the clock signal generating circuits were integrated onto the same chip as the microprocessor or other device. Regardless of whether they are "on-chip" or "off-chip," clock signal generating circuits usually rely upon an externally-located crystal oscillator to provide the reference frequency upon which the generated clock signal is based.

There are numerous ways in which a stable clock signal may be generated from an external reference clock signal. For example, frequency synthesizer circuits, such as a phase-locked loops (PLL) and delay-locked loops (DLL), are commonly used for generating relatively stable clock signals from a reference clock signal provided, e.g., by a crystal oscillator. In an ideal situation, frequency synthesis would result in one or more clocking signals, which are in phase and/or frequency alignment with the reference clock signal.

A PLL, for example, is a closed-loop device that utilizes a voltage-controlled oscillator (VCO) for obtaining accurate phase and frequency alignment between two signals, typically referred to as feedback and reference clock signals. Conventional PLLs generally include four main components: a phase frequency detector (PFD), a charge (or voltage) pump, a filter and a voltage controlled oscillator (VCO). The PFD monitors the phase/frequency difference between an externally-provided reference signal and a feedback signal generated by the VCO, and as a result, generates compensating "up" and "down" control signals when the feedback signal lags or leads the reference frequency or phase. The up/down control signals are passed through the charge pump and filter to produce a control voltage for controlling the VCO. The up/down control voltages drive the VCO (by increasing/decreasing the oscillation frequency therein) to maintain a predetermined phase relationship between the reference and feedback signals. Though similar, a DLL generally differs from a PLL in that it uses a delay line, instead of a VCO, for obtaining accurate phase and frequency alignment between the feedback and reference signals.

However, a problem occurs when the reference clock signal supplied to a PLL or DLL becomes unstable. For example, when the frequency of the reference clock signal drifts, or changes radically to a different rate, the output signal generated by the VCO (or delay line) follows suit by attempting to achieve phase lock with the new, albeit incorrect, frequency of the reference clock signal. This may cause data to be clocked at the wrong points, resulting in erroneous communication between integrated circuit components.

Many prior art systems have ways of detecting and reporting a momentary loss of phase lock caused by a relatively unstable or lost reference clock signal. For example, clock monitoring circuits are currently used for detecting the loss of a reference clock signal, and for producing or selecting an alternate clock signal to replace the lost signal. However, most prior art circuits cannot detect a loss of phase lock caused, e.g., by jitter or other sources of noise within the PLL or DLL. In other words, conventional clock monitoring circuits fail to identify the direction in which the feedback clock is pulling away from the reference clock when the PLL/DLL is "unlocked" and, therefore, cannot determine whether the feedback clock frequency is faster or slower than the reference clock frequency. The direction in which the PLL/DLL is pulling out of "lock" represents valuable information, which could be used for diagnosing or even correcting the state of the clock.

For at least these reasons, a need remains for an improved circuit and method for monitoring and reporting the status of a first clock signal (e.g., a feedback clock signal) relative to a second clock signal (e.g., a reference clock signal). The reported status preferably indicates whether the frequency of the first clock signal is faster, slower or substantially equivalent to (i.e., in phase/frequency lock with) the frequency of the second clock signal.

SUMMARY OF THE INVENTION

The problems outlined above may be in large part addressed by an improved circuit and method for monitoring and reporting the status of a clock signal. Unlike conventional circuits and methods, the reported status may indicate that the clock signal frequency is faster, slower or substantially equal to a reference clock frequency supplied to the circuit. In some cases, the reported status may also indicate a real-time frequency count of the clock signal. The reported status be used to monitor the integrity of a clock source (e.g., the state of a PLL loop) during system power-up, or sometime thereafter. In one example, the status may be stored as a bit pattern within a status register, so that one or more status bits may be read to ascertain the integrity of the clock source.

According to one embodiment of the invention, a method for monitoring the status of a clock signal may include supplying a first clock signal and a second clock signal to a clock monitor circuit, and monitoring a status of the first clock signal relative to the second clock signal. As noted above, the status may indicate whether the frequency of the first clock signal is FASTER, SLOWER, or substantially EQUIVALENT TO the frequency of the second clock signal. Once determined, the status may be stored as a bit pattern within a status register, which is operatively coupled to the clock monitor circuit. This may enable the status to be read by detecting a logic state of one or more bits stored within the status register.

In a general embodiment, the step of monitoring may include counting a number of pulses X associated with the first clock signal, and a number of pulses Y associated with the second clock signal, until the Y-number of pulses reaches a predetermined maximum number. Next, the method may determine the status of the first clock signal relative to the second clock signal by comparing the X-number of pulses with the Y-number of pulses. For example, the status may be determined to be: FAST, if the X-number of pulses is substantially greater than the Y-number of pulses; EQUIVALENT, if the X-number of pulses is substantially equal to the Y-number of pulses; or SLOW, if X-number of pulses is substantially less than the Y-number of pulses.

In a more specific embodiment, the step of monitoring may include counting a number of pulses X associated with the first clock signal, and a number of pulses Y associated with the second clock signal, until the Y-number of pulses reaches a predetermined maximum number. Next, the method may store the X-number of pulses as a bit pattern within an M-bit storage element, and the Y-number of pulses as another bit pattern within an N-bit storage element. In most cases, N may be substantially equal to M-1. Finally, the method may determine the status of the first clock signal relative to the second clock signal by detecting a logic state of one or more bits stored within the M-bit storage element. For example, the status may be determined to be: FAST, if a most significant bit of the M-bit storage element is a logic 1; EQUIVALENT, if the most significant bit of the M-bit storage element is a logic 0, and the next Z-number of bits within the M-bit storage element are each logic 1; or SLOW, if the most significant bit of the M-bit storage element is a logic 0, and at least one of the next Z-number of bits within the M-bit storage element is a logic 0. In most cases, the number Z may be some integer value less than or equal to M-1.

A circuit for monitoring the status of a clock signal is also contemplated herein. In one embodiment, the circuit may include an M-bit counter and an N-bit counter. The M-bit counter may be used for counting a number of clock pulse X occurring within a first clock signal supplied to the circuit, whereas the N-bit counter may be used for counting a number of clock pulses Y occurring within a second clock signal supplied to the circuit. In most cases, N may be substantially equal to M-1. In addition to the above-mentioned counters, the circuit may include control logic for determining if the N-bit counter has reached a predetermined maximum count. If the predetermined maximum count has been reached, the control logic may use one or more bits stored within the M-bit and N-bit counters to determine the status of the first clock signal relative to the second clock signal. As noted above, the status may indicate whether a frequency of the first clock signal is FASTER, SLOWER, or substantially EQUIVALENT TO a frequency of the second clock signal.

BRIEF DESCRIPTION OF THE DRAWINGS

Other objects and advantages of the invention will become apparent upon reading the following detailed description and upon reference to the accompanying drawings in which.

Figure 1:
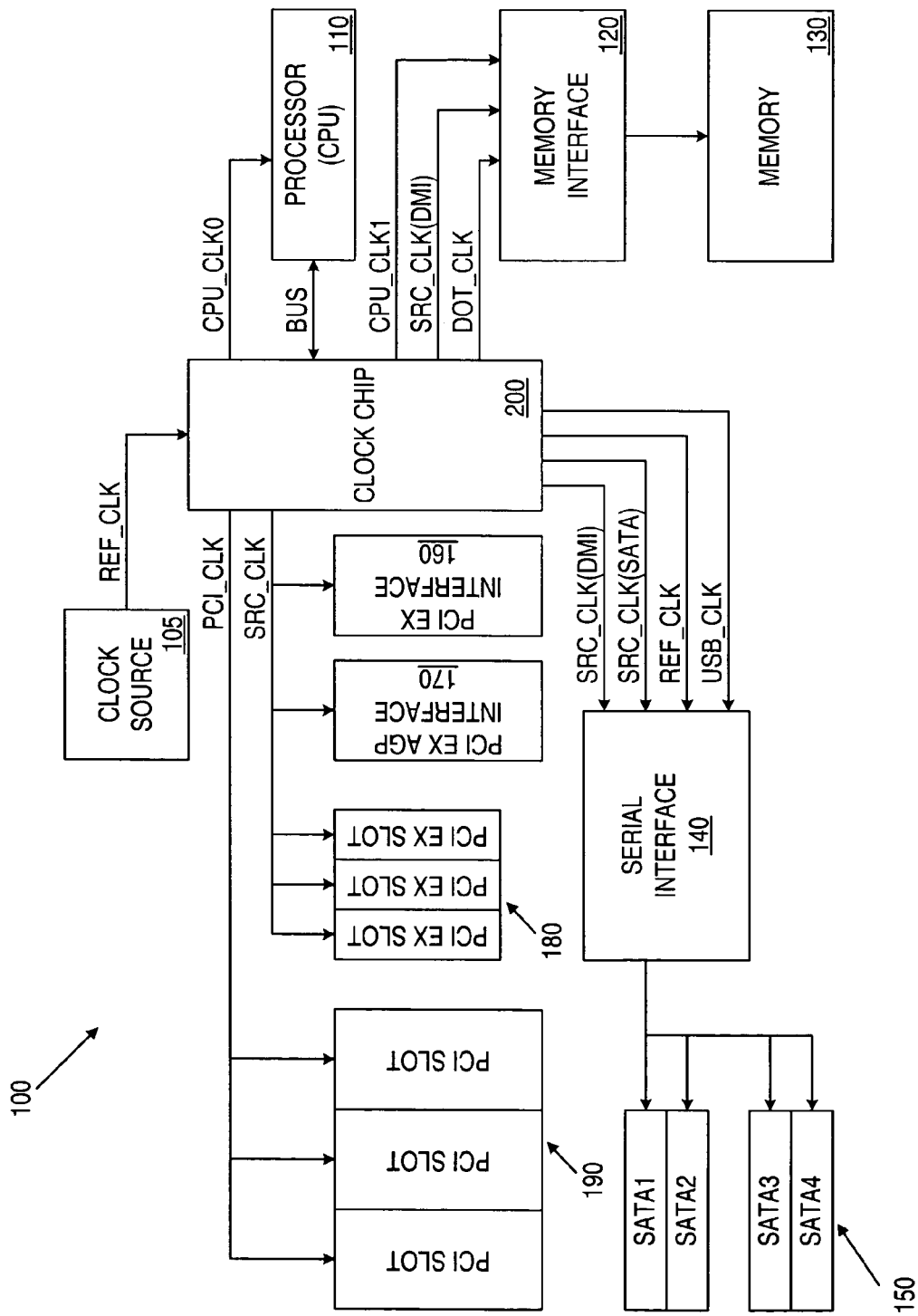
FIG. 1 is a block diagram of an exemplary computer system including a clock generation circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Many electronic systems include one or more synchronous components that rely on receiving related signals at substantially the same time to maintain proper operating characteristics of the electronic system. Such a synchronous system may be, in one example, a computer system, which typically includes a multitude of interrelated system components each designed to perform a particular operation in response to a clock signal. In some cases, the transfer of data between system components may be synchronized by one or more clock signals originating from a common source. The system components may receive the clock signals through a clocking network, which generally includes clock generation and distribution circuits.

In some cases, clock generation may be accomplished by manipulating the output of an external clock source, such as a crystal oscillator, to generate a plurality of clock signals according to the needs of various components within the computer system. The generated clock signals may then be fanned out to the system components, via a clock distribution network.

FIG. 1 is a block diagram of an exemplary computer system 100 including a clock generation circuit (otherwise referred to herein as a "clock chip") 200 and various system components that may rely on the clocking signals generated by circuit 200. It is noted, however, that computer system 100 illustrates only one exemplary embodiment of system components that may rely on the clocking signals generated by circuit 200. Computer system 100 should not be limited to the embodiment shown, and may include additional or alternative components not illustrated in the figure.

In the embodiment of FIG. 1, clock chip 200 supplies clocking signals to central processing unit (CPU) or microprocessor 110, memory interface 120, serial interface 140 and various I/O interfaces and slots (such as PCI, PCI EX, USB, etc.). In the embodiment shown, the clocking signals are supplied to PCI EX interface 160, PCI EX Advanced Graphics Port (AGP) interface 170, PCI EX slots 180 and PCI slots 190. In general, the clocking signals supplied to the various system components may be tailored to the needs of each component. For example, the clocking signals [CPU_CLK1, SRC_CLK(DMI), and $DOT_{13}$ CLK] supplied to memory interface 120 may have the appropriate frequency, phase, duty cycle, etc. required for controlling access to memory 130. Likewise, serial interface 140 may be supplied with the necessary clocking signals [SRC_CLK(DMI), SRC_CLK (SATA), REF_CLK, USB_CLK] for accessing/controlling Serial Advanced Technology Attachment (SATA) ports 150. As described in more detail below, clock chip 200 may include a plurality of internal registers (referred to herein as "status registers") for storing the "status" of the clock chip. Microprocessor 110 may write (or read) the clock chip status by writing (or reading) one or more bits to (or from) the internal status registers.

Figure 2:
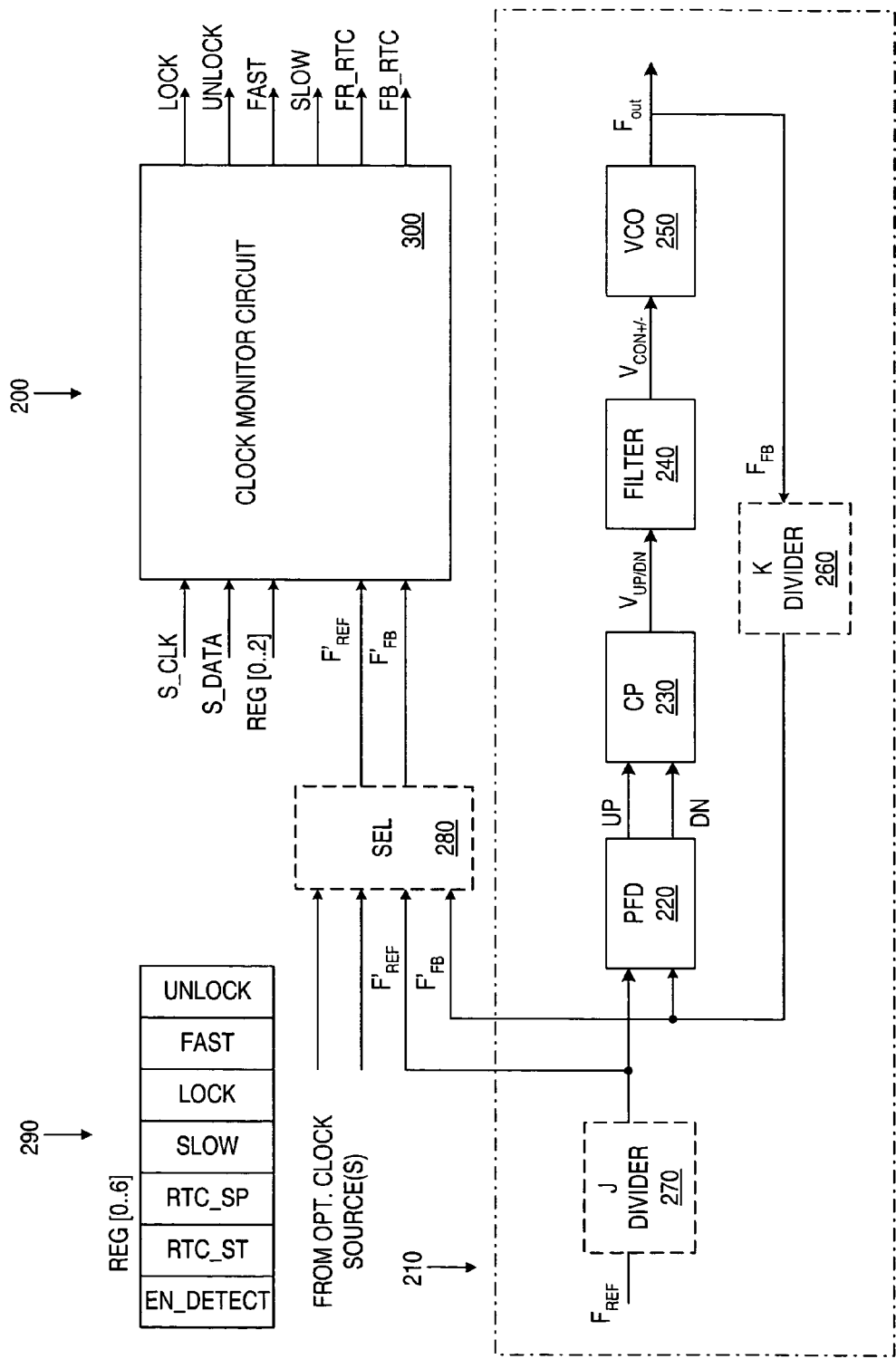
FIG. 2 is a block diagram of the clock generation circuit of FIG. 1 which, according to one embodiment of the invention, may include a clock source (e.g., a PLL) for supplying a pair of clocking signals to a clock monitoring circuit configured for monitoring and reporting the status of one clock signal relative to another.

FIG. 2 is a block diagram of exemplary components that may be incorporated within clock chip 200 for generating the clocking signals used by internal components of the computer system. In general, clock chip 200 may include at least one frequency synthesizer or clock signal generator 210 coupled to a circuit 300 (hereinafter referred to as a "clock monitor circuit"), which is uniquely configured for monitoring and reporting the status of the clock signal(s) generated by circuit 210. In the particular embodiment shown in FIG. 2, clock monitor circuit 300 is coupled for receiving a reference clock signal (having a reference frequency, $F'_{REF}$) and a feedback clock signal (having a feedback frequency, $F'_{FB}$) from a phase-locked loop (PLL) device 210. As described below, clock monitor circuit 300 may be configured for monitoring and reporting the status of the feedback clock signal relative to the reference clock signal. Unlike conventional clock monitor circuits, the status reported by clock monitor circuit 300 may indicate whether the feedback frequency is faster, slower or substantially equal to (i.e., in phase-lock with) the reference frequency.

Though only one clock signal generator 210 is shown in the embodiment of FIG. 2, clock monitor circuit 300 may be configured for monitoring the status of clock signals generated by one or more additional (or alternative) clock sources located internal and/or external to clock chip 200. Potential clock sources may include a delay-locked loop (DLL), or any other clock source capable of generating a stable clock signal. In some cases, selection means 280 may be included within clock chip 200 to provide clock monitor circuit 300 with the capability of monitoring clock signals from multiple clock sources (not shown). The selection means is illustrated in FIG. 2 with a dotted outline to indicate an optional component that may not be included within all embodiments of the invention. If included, selection means 280 could be implemented with substantially any hardwired or programmable means, such as a multiplexer, programmable fuses, or hardware or software implemented logic. If included, selection means 280 could enable the clock monitor circuit 300 to compare any two external clock sources.

In the embodiment of FIG. 2, a reference clock signal, $F_{REF}$, is supplied to phase-locked loop (PLL) 210 by an external clock source, such as clock source 105 of FIG. 1. Popular clock sources may include RC oscillators and LC oscillators, which are fairly stable at relatively high frequencies. However, a crystal oscillator may be used as an external clock source in systems that require greater stability at even higher frequencies. Thus, external clock source 105 may be any source capable of generating a stable reference signal at a known frequency (such as, e.g., a voltage controlled crystal oscillator).

The input reference signal, $F_{REF}$, supplied to PLL 210 includes both frequency and phase information. In some embodiments, the reference frequency may be divided to produce a modified reference clock frequency ($F'_{REF}$), which is substantially faster or slower than the frequency generated by the external clock source. For example, reference frequency divider 270 may be included for dividing the reference frequency by a factor of J (where J can be substantially any fractional or integer value). In some cases, reference frequency divider 270 may be included to allow the use of higher frequency sources (such as crystal oscillators). However, reference frequency divider 270 is illustrated in FIG. 2 with dotted outlines, and therefore, may not be included in all embodiments of the invention.

In general, PLL 210 may be implemented with substantially any well-known phase-locked loop design, although less known implementations may also be used. For example, PLL 210 may include phase frequency detector (PFD) 220, charge pump (CP) 230, filter 240 and voltage controlled oscillator (VCO) 250. PFD 220 is generally coupled for receiving the reference clock signal from the external clock source and a feedback clock signal generated by VCO 250. Like the reference frequency, the feedback frequency ($F_{FB}$) may or may not be divided by a factor of K (where K can be substantially any fractional or integer value) to produce a modified feedback clock frequency ($F'_{FB}$). Regardless of whether or not the signals are divided, PFD 220 may compare the feedback signal to the reference signal, and generate a corrective output pulse (e.g., a pump UP or pump DOWN pulse) in response to the phase difference therebetween.

The corrective output pulses from PFD 220 may be used to "phase lock" the feedback signal to the reference signal. For example, the UP/DOWN control signals from PFD 220 are passed through charge pump 230 and filter 240 to produce a control voltage ($V_{CON+/-}$), which is supplied to VCO 250. VCO 250 converts the voltage information into a corresponding output frequency ($F_{OUT}$) by increasing or decreasing the oscillation frequency therein. Over time, the UP/DOWN control voltages drive the VCO to maintain a predetermined phase relationship between the reference and feedback signals.

As shown in FIG. 2, the VCO output frequency ($F_{OUT}$) is sent back to PFD 220 via a negative feedback loop. In some cases, an optional feedback frequency divider 260 may be included for dividing the output frequency from the VCO (by a factor of K) before the feedback signal is supplied to the PFD. In this manner, feedback frequency divider 260 may be used to provide additional flexibility by modulating the VCO output frequency by $F_{OUT}=(K/J) F_{REF}$.

In some cases, external power supply and temperature variations may cause the PLL to become unstable (e.g., $F_{FB}$ may become significantly greater than $F_{REF}$) or the VCO to become too slow for the PLL to remain "locked." For this reason, clock monitor circuit 300 may be included within clock chip 200 for monitoring the reference and feedback clock frequencies to determine the current "state of the loop." For example, clock monitor circuit 300 may be used to determine whether the PLL output frequency is "locked" or "unlocked," and if unlocked, whether the PLL output frequency is faster or slower than the reference frequency supplied thereto. As described in more detail below, clock monitor circuit may be used, in some embodiments, for determining a real-time frequency count of the reference and feedback clock signals, thereby providing additional information about the state of the loop.

Figure 3:
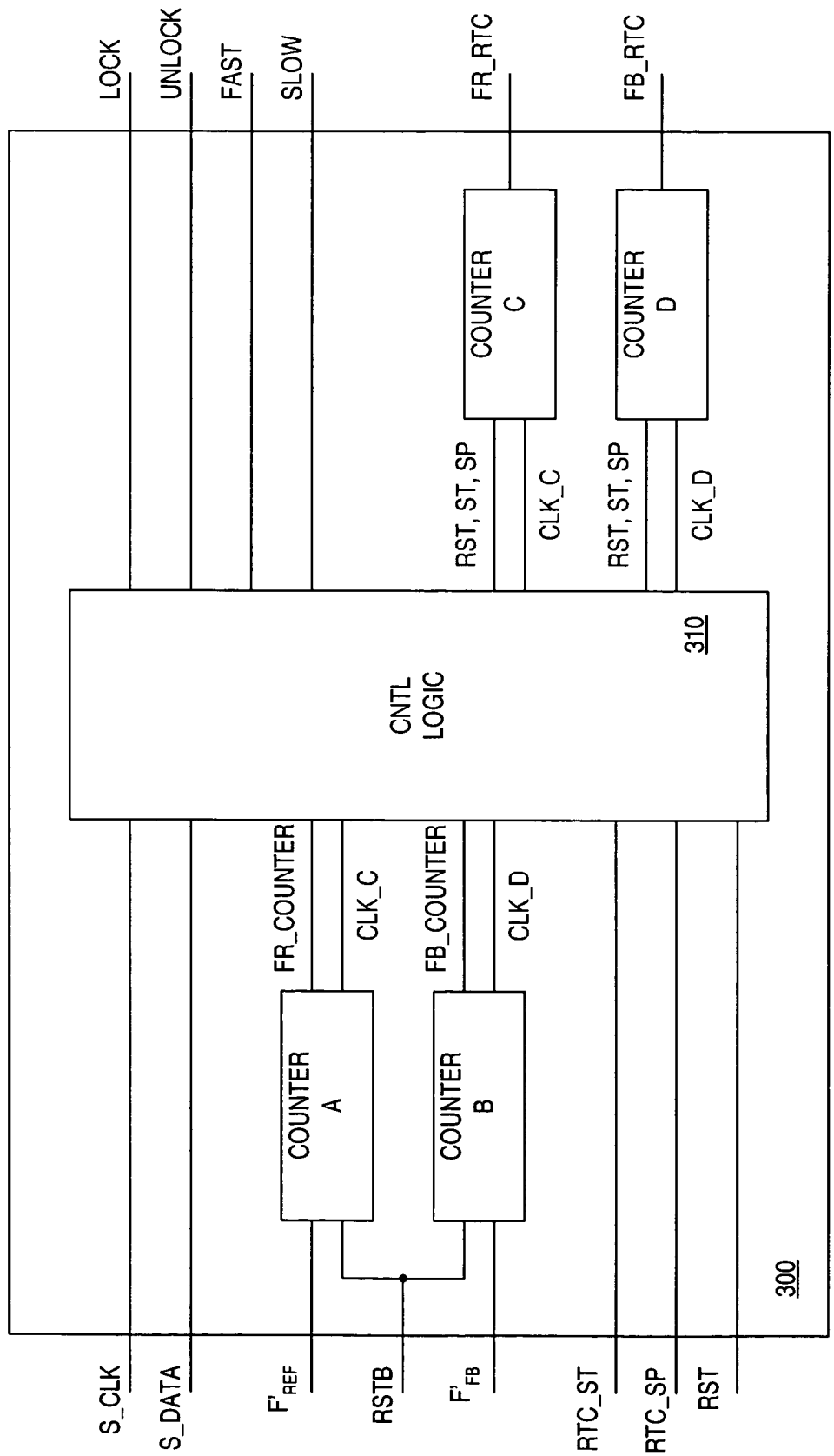
FIG. 3 is a block diagram of the exemplary clock monitoring circuit of FIG. 2 in more detail.

FIGS. 2 and 3 illustrate one embodiment of a clock monitor circuit, in accordance with the present invention. As shown in FIG. 2, clock monitor circuit 300 may be coupled for receiving a reference clock frequency ($F_{REF}$ or $F'_{REF}$) and a feedback clock frequency ($F_{FB}$ or $F'_{FB}$) from PLL 210. As noted above, however, circuit 300 may be additionally or alternatively coupled for receiving signals from other clock sources (not shown) via optional selection means 280. In addition to the reference and feedback signals, circuit 300 may be coupled for reading/writing status and control information from/to storage element 290. In one embodiment of the invention, storage element 290 may comprise an I2C register located on the periphery of clock chip 200 and accessible to various system components via a common I2C bus. However, storage element 290 is not limited to an I2C register, and may be alternatively implemented with substantially any storage means having read/write capability. It is also noted that, although storage element 290 is shown having a particular number of bits (i.e., seven) stored in a particular order, storage element 290 may be configured to include any number and/or order of status and control bits, in alternative embodiments of the invention.

As shown in FIG. 3, clock monitor circuit 300 may be coupled to storage element 290 for receiving a reset bit (RSTB), which functions to activate clock monitor circuit 300 when set to the appropriate logic level (e.g., logic 0 or LOW). Once activated, clock monitor circuit 300 may be generally configured for monitoring the reference and feedback clock frequencies to determine the current "state of the loop." For example, circuit 300 may track the feedback and reference frequencies to determine whether the PLL (or other internal clock source) is "LOCKED", "UNLOCKED", "FAST" or "SLOW." Once determined, the PLL status may be stored within storage element 290 as a bit pattern with one or bits asserted (e.g., logic 1 or HIGH) to indicate the determined status. The status bits stored within storage element 290 (otherwise referred to herein as a "status register") may be later accessed by one or more system components, which may be coupled to the storage element by a common bus (denoted generically by S_DATA). In the embodiment of a computer system, storage element 290 may be accessed by a microprocessor, such as CPU 110 of FIG. 1.

In some cases, clock monitor circuit 300 may receive a pair of control bits (RTC_ST, RTC_SP) from storage element 290 for starting and stopping a real-time count of the reference and feedback clock signals (denoted FR_RTC and FB_RTC, respectively). Though not illustrated in the figures, the real-time counts provided by circuit 300 may be divided by the number of system clock (S_CLK) periods over which the count was performed to provide a true indication of the reference and feedback clock frequencies. If the external clock source is functioning properly (i.e., outputting the appropriate reference clock frequency), the real time counts may be used to determine the actual difference between the reference and feedback clock frequencies This information may be provided instead of, or in addition to, the reported status (i.e., whether the feedback clock is "LOCKED," "UNLOCKED," "FAST," or "SLOW").

FIG. 3 is a block diagram illustrating clock monitor circuit 300 in more detail, according to one embodiment of the invention. As shown in FIG. 3, clock monitor circuit 300 may include a plurality of counters (e.g., counters A, B, C, and D) and a control logic block 310 for determining the state of the PLL based on the results from at least two of the counters. More specifically, circuit 300 may include a first counter (A) for counting the number of pulses within the reference clock signal (FR_COUNTER), and a second counter (B) for counting the number of pulses within the feedback clock signal (FB_COUNTER). The number of pulses within the reference and feedback clock signals may be counted until FR_COUNTER reaches a predetermined maximum count value, which as described below, may be based on the size of counter A.

Assume, for example, that counters A and B are respectively implemented as N-bit and M-bit storage elements, and that N is substantially equal to M-1. In one example, counters A and B may be implemented as 4-bit and 5-bit registers; however, smaller or larger number of register bits may also be used when trading-off accuracy with power and area consumption. Regardless of the number of register bits included within counters A and B, control logic block 310 may determine that the maximum count value has been reached when all counter A bits are asserted (e.g., logic 1 or HIGH). In other words, the maximum count value may be substantially equal to $2^N$, where N is the number of bits within the N-bit storage element (i.e., counter A). Once the maximum count value has been reached, control logic block 310 may determine the status of the feedback signal relative to the reference signal (i.e., the state of the PLL) by detecting a logic state of one or more bits within the M-bit storage element (i.e., counter B). An exemplary manner in which the control logic block may perform these functions is shown in FIG. 4 and described in more detail below.

In some embodiments of the invention, counters C and D may be included within circuit 300 to provide a real-time count of the reference and feedback clock signals. If included, counters C and D may begin to count the number of pulses (FR_RTC) occurring within the reference clock signal (denoted CLK_C) and/or the number of pulses (FB_RTC) occurring within the feedback clock signal (denoted CLK_D) upon receiving an asserted "real-time count start" bit (RTC_ST) from storage element 290. The real-time count may continue until the RTC_ST bit is deasserted, and a "real-time count stop" bit (RTC_SP) is asserted within storage element 290. In some cases, the RTC_ST and RTC_SP bits may be asserted (e.g., logic 1 or HIGH) at any time by a user of the system. For example, the user may initiate a real-time count by supplying an appropriate signal to a system reset (RST) pin. In other cases, however, the real-time count may be initiated by an internal reset (RST) signal supplied, e.g., by a system power-on/reset (POR) circuit. In such cases, the RST signal may be supplied during the initial power-on, or subsequent reset, of the system.

Though not illustrated in the figures, the actual or "real-time" frequency of the reference and feedback clock signals may be determined in the following manner. Assume that the system clock (S_CLK) frequency is F MHz, and the number of S_CLK periods between the assertion of the real-time count start (RTC_ST) and real-time count stop (RTC_SP) bits is Q. Assume also that the number of reference clock periods (FR_RTC) occurring within the Q time frame is R, while the number of feedback clock periods (FB_RTC) is S. With these assumptions, the actual real-time frequency would be approximately F(R/Q) MHz for the reference clock signal and F(S/Q) MHz for the feedback clock signal. The accuracy with which the real-time frequency is determined is dependent on the size of counters C and D. The accuracy may be increased/decreased by using larger/smaller counters.

Figure 4:
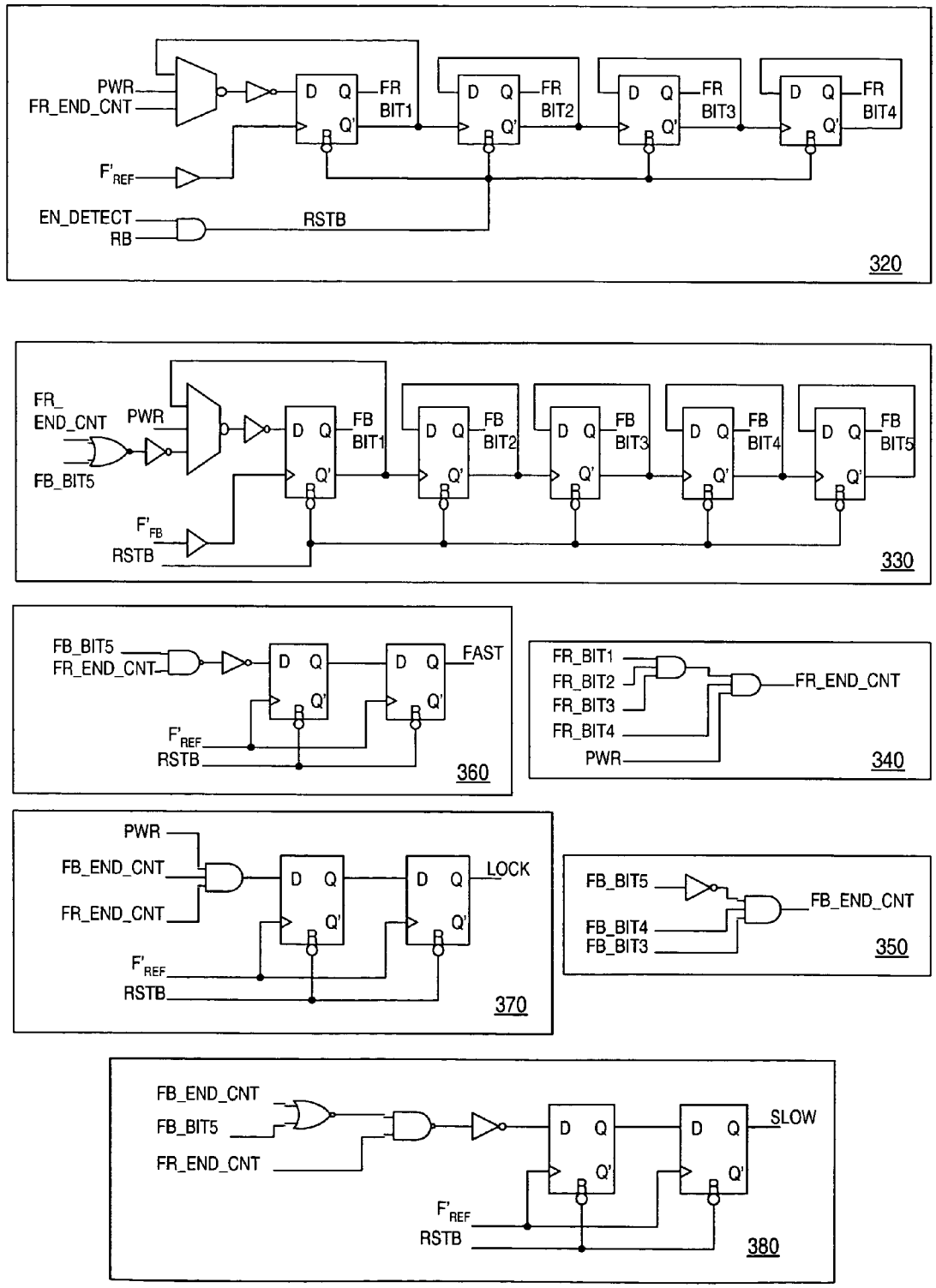
FIG. 4 shows exemplary logic diagrams of various components within the clock monitoring circuit of FIG. 3.

FIG. 4 illustrates one embodiment in which counters A and B and control logic 310 may be implemented. It is noted, however, that counters A and B and control logic 310 are not limited to the single embodiment shown. Instead, one skilled in the art would readily understand how the logic components and/or control signal levels could be modified, while maintaining the functionality described herein.

In the embodiment of FIG. 4, counter A (logic block 320) is a 4-bit ripple counter including four D-type flip-flops, where each flip-flop stores one bit of the reference frequency count (FR_COUNTER). As described in more detail below, counter B may be slightly larger than counter A. In one example, counter B (logic block 330) is a 5-bit ripple counter with five D-type flip-flops, each storing one bit of the feedback frequency count (FB_COUNTER). As shown in FIG. 4, the RSTB signal may hold the counter flip-flops in reset when at a logic LOW level. In some cases, the RSTB may be generated by a logical AND of signals RB and EN_DETECT, as shown in logic block 320 of FIG. 4. The RB may correspond, for example, to a reset signal generated by a power-on/reset (POR) circuit that resets the device at power up. After system power-up, the RB signal may transition HIGH and stay HIGH. As shown in FIG. 2, the EN_DETECT signal may be defined as a bit in the status register (290), which can be set to logic HIGH for enabling the clock monitor circuit. Otherwise, the EN_DETECT signal may be held LOW, or deasserted, to power down the clock monitor circuit and save valuable resources. In the embodiment of FIG. 4, the EN_DE- TECT and RB signals are both held HIGH to activate the clock monitor circuit (due to the AND gate configuration). However, one skilled in the art would readily understand how the logic could be reconfigured to operate with alternative logic levels.

Once initiated, counters A and B may count the number of pulses occurring within the reference and feedback clock signals until a maximum number of reference clock pulses has been reached. As shown in logic block 340, the maximum count value (i.e., the reference frequency end count, FR_END_CNT) may be reached when all bits (FR_BIT1 . . . FR_BIT4) within counter A are asserted logic HIGH. Once the maximum number of reference clock pulses has been reached, logic block 350 determines the feedback frequency end count (FB_END_CNT) by logically ANDing the inverse of FB_BIT5 (i.e., the most significant bit, MSB) with one or more of the next MSBs (e.g., FB_BIT4 and FB_BIT3) within counter B. As described in more detail below, the number of bits used to produce the FB_END_CNT signal depends on the desired accuracy of the clock monitor circuit.

Logic blocks 360, 370, and 380 illustrate one manner in which control logic block 310 may determine the "state of the loop," or in other words, the status of the feedback signal relative to the reference signal. As noted above, the size of the feedback counter (counter B) may be slightly greater than that of the reference counter (counter A). In the embodiment of FIG. 4, the feedback counter contains exactly one more bit (FB_BIT5) than the number of bits included within the reference counter. This additional bit is used to determine the status of the feedback signal, and more specifically, whether the feedback frequency is faster, slower or substantially equal to the reference frequency.

For example, logic block 360 may determine that the feedback frequency is faster than the reference frequency if the most significant bit of the feedback counter (FB_BIT5) is logic HIGH. In other words, if the most significant bit of the feedback counter is asserted, the feedback count value must be greater than the maximum count value allowed within the smaller reference counter. In such a case, logic block 360 would indicate that the PLL is "UNLOCKED" and "FAST" by setting the appropriate bits within status register 290.

If the most significant bit of the feedback counter is not asserted (i.e., logic LOW), logic blocks 370 and 380 may determine that the PLL is "LOCKED," or that the PLL is "UNLOCKED" and "SLOW." As shown in FIG. 4, for example, logic blocks 370 and 380 each receive the FB_END_CNT signal from logic block 350. If the FB_END_CNT signal is asserted (e.g., logic HIGH), logic block 370 may determine that the feedback frequency is substantially equal to the reference frequency (within a predetermined percentage, such as 20%). However, if the FB_END_CNT signal is not asserted (e.g., logic LOW), logic block 380 may determine that the feedback frequency is slower than the reference frequency.

As shown in logic block 350, the FB_END_CNT signal is asserted only when the most significant bit of the feedback counter (FB_BIT5) is LOW and the next one or more most significant bits (e.g., FB_BIT4 and FB_BIT3) are HIGH. The FB_END_CNT signal is deasserted when FB_BIT5 is HIGH, or at least one of FB_BIT4 and FB_BIT3 is LOW. Thus, depending on FB_BIT5 and the outcome of FB_END_CNT, logic blocks 370/380 may indicate that the PLL is "LOCKED," or that the PLL is "UNLOCKED" and "SLOW," by setting the appropriate bits within status register 290.

As noted above, the number of bits used to produce the FB_END_CNT signal may depend on the desired accuracy of the clock monitor circuit. In FIG. 4, the feedback end count signal (FB_END_CNT) is determined by logically ANDing the inverse of FB_BIT5 with FB_BIT4 and FB_BIT3. By leaving out the two least significant bits of counter B (i.e., FB_BIT2 and FB_BIT1), the "LOCK" signal generated by logic block 370 may be asserted whenever the feedback clock frequency ($F'_{FB}$) is within 20% of the reference clock frequency ($F'_{REF}$).

For example, if counter A of FIG. 4 is a 4-bit counter, the total time duration for its full 16 count cycle can be expressed as:

$$T_{FR(TOTAL)} = 16 \times T_{FR}, \quad \text{(EQ. 1)}$$

where $T_{FR}$ is the time period of one reference clock cycle. Now, if counter B is a 5-bit counter, the FB_END_CNT signal may be generated if counter B reaches a minimum count of 12 when counter A completes its full count cycle. This corresponds to a feedback clock period ($T_{FB}$) of:

$$T_{FB} = (16/13) T_{FR}. \quad \text{(EQ. 2)}$$

Or, in terms of frequency, $$F_{FB} = (13/16) F_{FR} \quad \text{(EQ. 3)}$$

$$F_{FB} = 0.8 F_{FR}. \quad \text{(EQ. 4)}$$

Thus, the "LOCK" signal is generated by logic block 370 when the feedback clock frequency ($F'_{FB}$) is within about 20% of the reference clock frequency ($F'_{REF}$). However, this simple derivation assumes that the feedback frequency is initially slower than the reference frequency and is ramping up.

In general, the PLL may be considered to be "LOCKED" when the feedback end count ranges between about 12-15, when counter A is a 4-bit counter, counter B is a 5-bit counter and a LOCK condition is considered to occur when the feedback frequency is within 20% of the reference frequency. In other words, a feedback end count of about 12-15 (in the current example) may indicate that the feedback frequency is substantially equal to the reference frequency. Feedback end counts smaller than 12 indicate that the PLL is "UNLOCKED" and "SLOW" and feedback end counts larger than 15 indicate that the PLL is "UNLOCKED" and "FAST."

In some cases, phase lock detection accuracy may be increased/decreased by increasing/decreasing the number of feedback counter bits used to determine the feedback end count signal (FB_END_CNT). In other cases, the lock detection accuracy may be increased/decreased by increasing/decreasing the number of bits within counters A and B. In one example, counter A may be implemented as an 8-bit counter, counter B may be implemented as a 9-bit counter and a LOCK condition may be detected when the feedback frequency is within 10% of the reference frequency (e.g., when the feedback count is within about 230-282).

Figure 5:
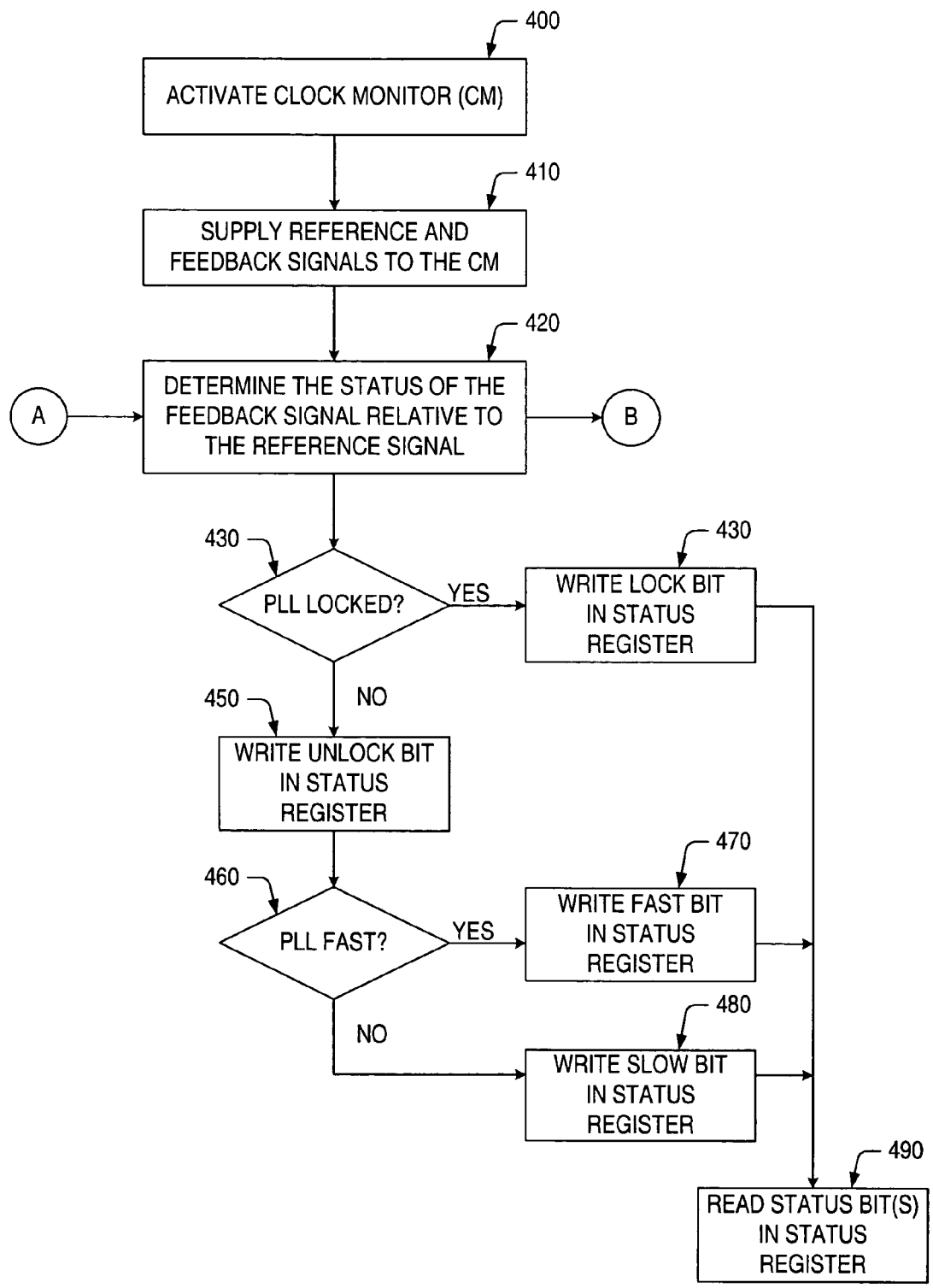
FIG. 5 is a flowchart diagram of a method for monitoring the status of a clock signal, according to one embodiment of the invention.
Figure 6:
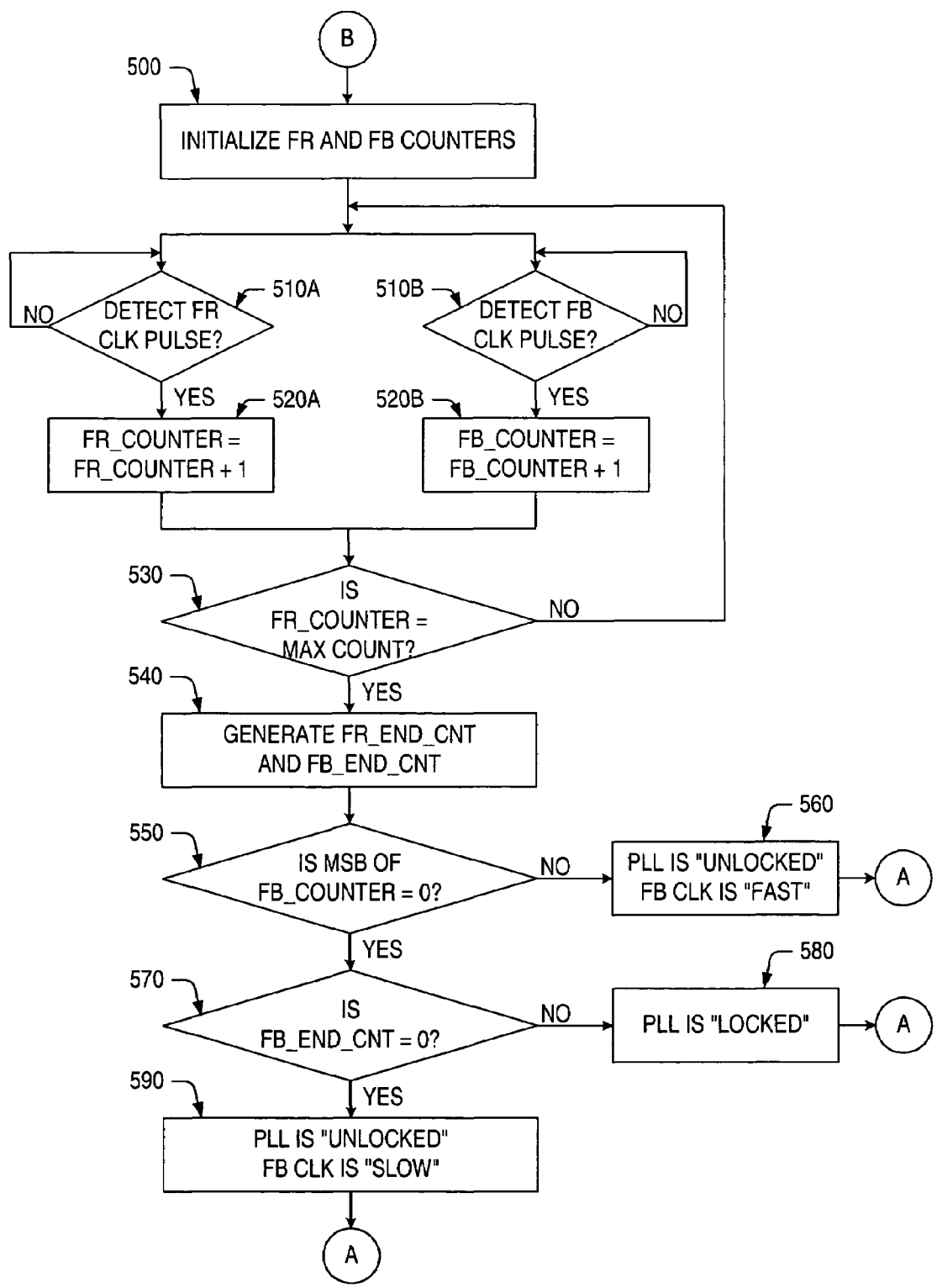
FIG. 6 is a flowchart diagram of a method for determining the status of a first clock signal (e.g., a feedback clock signal generated by a PLL) relative to a second clock signal (e.g., a reference clock signal supplied to the PLL), according to one embodiment of the invention.

FIGS. 5 and 6 illustrate an exemplary method for monitoring the status of a clock signal, in accordance with one embodiment of the invention. Though the illustrated methods are described in the context of monitoring feedback and reference clock signals obtained from a PLL device, the methods described herein are not limited to such signals. Instead, the methods described herein could be used (or modified) for monitoring clock signals obtained from one or more clock sources, in addition to (or instead of) those shown.

As shown in FIG. 5, the method for monitoring the status of a clock signal may begin by activating a clock monitor circuit in step 400. In some cases, the clock monitor circuit may be activated by setting an enable bit (e.g., EN_DETECT) in a status register (e.g., storage element 290) of the clock monitor circuit (e.g., clock monitor circuit 300). Before or during the step of activating the monitoring circuit, it may be necessary to clear any status bits (e.g., LOCK, UNLOCK, FAST, SLOW), which were stored within the status register during a previous monitoring cycle.

In most cases, the clock monitor circuit may be activated during a power-on/reset sequence of a system that utilizes the clock monitor circuit for determining the current state of a system clock or internal clock chip. In some cases, however, the clock monitor circuit may be activated sometime after the initial power-on/reset of the system. For example, the clock monitor circuit may be activated in response to an error signal associated with the system. The system error signal may then prompt a user of the system to activate the clock monitor circuit, so that the cause of the error may be diagnosed. Alternatively, additional logic may be included for automatically activating the clock monitor circuit once an error signal is detected. In some cases, the clock monitor circuit may be activated by a user of the system for substantially any reason and at any time after system power-up.

Once activated, a pair of clock signals may be supplied to the clock monitor circuit, as shown in step 410. In one embodiment, the pair of clock signals may include feedback and reference clock signals from a phase-locked loop (PLL) device, as described above in reference to FIGS. 2-4. It is noted, however, that alternative clocking signals may be used in other embodiments of the invention. In some cases, the pair of clock signals may be selected (via, e.g., selection means 280) from a plurality of clocking signals generated by one or more clock sources.

In step 420, the method may determine the status of the feedback clock signal relative to the reference clock signal, as described in more detail below in reference to FIG. 6. The status provided by the clock monitor circuit may be used to indicate the "state of the clock" (e.g., whether the PLL is "LOCKED," "UNLOCKED," "FAST," or "SLOW") by determining whether the feedback clock frequency is faster, slower or substantially equal to the reference clock frequency (within some tolerance).

Once determined, the status may be stored as a bit pattern within the status register of the clock monitor circuit. For example, if the PLL is determined to be "LOCKED" in step 430, a LOCK bit may be written to the status register in step 440; otherwise, an UNLOCK bit may be written in step 450. If UNLOCKED, the method may determine whether the PLL is FAST in step 460. If the PLL is considered to be FAST, a FAST bit may be written to the status register in step 470; otherwise, a SLOW bit may be written in step 480. After the appropriate bits are written to the status register, they may be read in step 490 by detecting a logic state of one or more bits within the status register.

In one embodiment, the status may be read by a system component(s) connected to the status register via a common bus. For example, the system component may detect a logic state of the bit stored in the LOCK position of the status register. If the LOCK bit is deasserted, the system component may detect a logic state of the bits stored in the FAST and SLOW positions to determine the direction in which the PLL is pulling out of "phase lock." In other cases, the system component may read all status bits at once to determine the state of the clock.

FIG. 6 illustrates an exemplary method for determining the status of one clock signal relative to another, as set forth in step 420 of FIG. 5. As shown in FIG. 6, the method may begin by initializing a pair of counters (e.g., counters A and B of FIG. 3). In the current method, the pair of counters may be used for counting the number of pulses occurring within reference and feedback clock signals obtained from a PLL, and as such, may be referred to herein as reference frequency (FR) and feedback frequency (FB) counters. However, the counters may be generically referred to as counters A and B in more general embodiments of the invention.

To count the number of pulses, the method determines whether a reference (FR) or feedback (FB) clock pulse has occurred in steps 510A and 510B. If a pulse is detected, the appropriate counter is incremented in steps 520A and 520B to account for the pulse. The detection step is repeated until a pulse is detected, and each new pulse is added to the count values stored within the reference (FR) and feedback (FB) counters, until the FR counter reaches a maximum count value. As noted above, the maximum count value may N be substantially equal to $2^N$, where N is the number of bits in the FR counter.

Once the maximum count value has been reached (in step 530), a reference frequency end count signal (FR_END_CNT) and a feedback frequency end count signal (FB_END_CNT) may be generated in step 540. For example, the FR_END_CNT signal may be generated and asserted HIGH when all bits of the FR counter are logic 1. In some cases, the FB_END_CNT signal may be generated by logically ANDing an inverse of the most significant bit (MSB) of the FB counter (e.g., FB_BIT5) with the next two MSBs of the FB counter (e.g., FB_BIT4 and FB_BIT3). However, a smaller or larger number of FB counter bits may be logically combined to generate the FB_END_CNT signal, in other cases. The generated signals may then be used, along with the most significant bit of the FB counter, to determine the current "state of the loop."

If the most significant bit of the FB counter (e.g., FB_BIT5) contains a logic 1 in step 550, the method may determine that the PLL is "UNLOCKED" and that the feedback clock frequency is "FAST." If, however, the most significant bit contains a logic 0, the generated FB_END_CNT signal may be used in step 570 to determine whether the PLL is "LOCKED," or otherwise, "UNLOCKED" and "SLOW." For example, the method may determine that the PLL is "LOCKED," in step 580, if the FB_END_CNT signal is asserted (logic "1) in step 570. If the FB_END_CNT signal is deasserted in step 570, the method may determine that the PLL is "UNLOCKED" and that the feedback clock frequency is "SLOW" in step 590.

As noted above, the FB_END_CNT signal may be asserted only when the next Z most significant bits in the FB counter are each logic 1. If at least one of the next Z most significant bits is logic 0, the FB_END_CNT signal will be deasserted. In the embodiment of FIG. 4, the next Z most significant bits include two bits, FB_BIT4 and FB_BIT3. In alternative embodiments, Z may be substantially any integer value less than or equal to N (or M-1). For example, the accuracy of the clock monitoring method may be increased by using a larger number of bits to determine the state of the FB_END_CNT signal.

It will be appreciated by those skilled in the art having the benefit of this disclosure that this invention is believed to provide an improved clock monitor circuit and method for determining the status of one clock signal relative to another. Unlike conventional circuits, the clock monitor circuit described herein utilizes a unique method for indicating a "state of the clock" by determining if the frequency of one clock signal is faster, slower or substantially equal to the frequency of the other clock signal. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for monitoring the status of a clock signal, the method comprising:
  supplying a first clock signal and a second clock signal to a clock monitor circuit; and
  monitoring a status of the first clock signal relative to the second clock signal, wherein the status indicates whether a frequency of the first clock signal is FASTER, SLOWER, or substantially EQUIVALENT TO a frequency of the second clock signal, and wherein the step of monitoring comprises:
    counting a number of pulses, X, associated with the first clock signal and a number of pulses, Y, associated with the second clock signal until the Y-number of pulses reaches a predetermined maximum count value; and
    determining the status of the first clock signal relative to the second clock signal by comparing the X-number of pulses with the Y-number of pulses, wherein the status is determined to be:
      FAST, if the X-number of pulses is substantially greater than the Y-number of pulses;
      EQUIVALENT, if the X-number of pulses is substantially equal to the Y-number of pulses; and
      SLOW, if X-number of pulses is substantially less than the Y-number of pulses.

2. The method of claim 1, wherein the step of supplying comprises selecting the first and second clock signals from a plurality of clocking signals generated by one or more clock sources.

3. The method of claim 1, wherein the method further comprises:
  storing the status as a bit pattern within a status register, which is operatively coupled to the clock monitor circuit; and
  reading the status by detecting a logic state of one or more bits stored within the status register.

4. The method of claim 3, wherein prior to the step of monitoring, the method further comprises activating the clock monitor circuit by:
  setting an enable bit in the status register; and
  clearing any status bits previously stored in the status register.

5. The method of claim 4, wherein the step of activating is performed during power-on reset (POR) of a system that utilizes at least one of the first and second clock signals.

6. The method of claim 4, wherein the step of activating is performed in response to an error signal associated with the system.

7. The method of claim 4, wherein the step of activating is performed by a user of the system at any time after a power-on reset (POR) of the system.

8. The method of claim 1, further comprising determining a real-time frequency count associated with the first and second clock signals, wherein the step of determining a real-time frequency count comprises:
  counting a number of pulses Q of a reference clock signal having a reference frequency F;
  counting a number of pulses R that occur within the first clock signal during a time frame defined by Q; and
  counting a number of pulses S that occur within the second clock signal during the time frame defined by Q.

9. The method of claim 8, wherein the step of determining a real-time frequency count further comprises:
  determining the real-time frequency count of the first clock signal by calculating F(R/Q); and
  determining the real-time frequency count of the second clock signal by calculating F(S/Q).

10. A method for determining the status of a first clock signal relative to a second clock signal, the method comprising:
  counting a number of pulses X associated with the first clock signal, and a number of pulses Y associated with the second clock signal, until the Y-number of pulses reaches a predetermined maximum count value;
  storing the X-number of pulses as a bit pattern within an M-bit storage element and the Y-number of pulses as another bit pattern within an N-bit storage element, where N=M-1;
  determining the status of the first clock signal relative to the second clock signal by detecting a logic state of using one or more bits stored within the M-bit storage element, wherein the status is determined to be:
    FAST, if a most significant bit of the M-bit storage element is a logic 1;
    EQUIVALENT, if the most significant bit of the M-bit storage element is a logic 0 and the next Z-number of bits within the M-bit storage element are each logic 1; or
    SLOW, if the most significant bit of the M-bit storage element is a logic 0 and at least one of the next Z-number of bits within the M-bit storage element is a logic 0.

11. The method of claim 10, wherein the predetermined maximum count value is substantially equal to $2^N$, where N is the number of bits in the N-bit storage element.

12. The method of claim 10, wherein the number, Z, is an integer value less than or equal to M-1.

13. A circuit for monitoring the status of a clock signal, the circuit comprising:
  an M-bit counter for counting a number of clock pulses X occurring within a first clock signal supplied to the circuit;
  an N-bit counter for counting a number of clock pulses Y occurring within a second clock signal supplied to the circuit, where N=M-1; and
  control logic for determining if the N-bit counter has reached a predetermined maximum count, and if so, using one or more bits stored within the M-bit and N-bit counters to determine the status of the first clock signal relative to the second clock signal, wherein the status indicates whether a frequency of the first clock signal is FASTER, SLOWER, or substantially EQUIVALENT TO a frequency of the second clock signal.

14. The circuit as recited in claim 13, wherein the control logic comprises:
  a first logic block coupled to the N-bit counter and configured for determining that the predetermined maximum count has been reached when all bits stored within the N-bit counter are logic 1; and
  a second logic block coupled to the M-bit counter and configured for determining an end count for first clock signal by logically ANDing an inverse of a most-significant bit in the M-bit counter with one or more next significant bits in the M-bit counter.

15. The circuit as recited in claim 14, wherein the control logic further comprises a third logic block coupled to the M-bit counter and the first logic block and configured for determining that the frequency of the first clock signal is FASTER than the frequency of the second clock signal when the most significant bit of the M-bit counter is a logic 1.

16. The circuit as recited in claim 14, wherein the control logic further comprises a fourth logic block coupled to the first and second logic blocks and configured for determining that the frequency of the first clock signal is substantially EQUIVALENT TO the frequency of the second clock signal when the most significant bit of the M-bit counter is a logic 0 and the end count for first clock signal is a logic 1.

17. The circuit as recited in claim 14, wherein the control logic further comprises a fifth logic block coupled to the first and second logic blocks and configured for determining that the frequency of the first clock signal is SLOWER than the frequency of the second clock signal when the most significant bit of the M-bit counter is a logic 0 and the end count for first clock signal is a logic 0.

18. The circuit as recited in claim 13, wherein the circuit further comprises a storage element coupled to the control logic for storing the status of the first clock signal relative to the second clock signal as a bit pattern, and wherein individual bits within the bit pattern indicate whether the frequency of the first clock signal is FASTER, SLOWER, or EQUIVALENT TO the frequency of the second clock signal.

19. The circuit as recited in claim 13, wherein the circuit further comprises a means for selecting the first and second clock signals from a plurality of clocking signals supplied to the circuit from one or more clock sources.

\* \* \* \* \*